United States Patent
Zhu et al.

(10) Patent No.: US 9,478,490 B2
(45) Date of Patent: Oct. 25, 2016

(54) CAPACITOR FROM SECOND LEVEL MIDDLE-OF-LINE LAYER IN COMBINATION WITH DECOUPLING CAPACITORS

(71) Applicant: QUALCOMM Incorporated, San Diego, CA (US)

(72) Inventors: John Jianhong Zhu, San Diego, CA (US); Stanley Seungchul Song, San Diego, CA (US); Kern Rim, San Diego, CA (US); Zhongze Wang, San Diego, CA (US); Jeffrey Junhao Xu, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/483,110

(22) Filed: Sep. 10, 2014

(65) Prior Publication Data

US 2016/0071795 A1    Mar. 10, 2016

(51) Int. Cl.
*H01L 21/02* (2006.01)
*H01L 27/108* (2006.01)
*H01L 21/00* (2006.01)
*H01L 23/522* (2006.01)
(Continued)

(52) U.S. Cl.
CPC ......... *H01L 23/5223* (2013.01); *H01L 21/311* (2013.01); *H01L 21/3213* (2013.01); *H01L 21/768* (2013.01); *H01L 21/823475* (2013.01); *H01L 27/0805* (2013.01); *H01L 28/60* (2013.01); *H01L 29/66545* (2013.01)

(58) Field of Classification Search
CPC ............... H01L 23/5223; H01L 27/10852; H01L 28/40; H01L 28/91; H01L 21/8242; H01L 21/76801; H01L 21/311; H01L 21/3213; H01L 21/768; H01L 21/823475; H01L 28/60; H01L 29/66545
USPC ......... 257/532, 300, E27.087; 438/393, 154, 438/957, 396, 238
See application file for complete search history.

(56) References Cited

U.S. PATENT DOCUMENTS 6,136,643 A * 10/2000 Jeng ................. H01L 28/91
                                               257/E21.019
6,258,649 B1 * 7/2001 Nakamura ........ H01L 21/76801
                                               257/E21.008
(Continued)

FOREIGN PATENT DOCUMENTS

JP     2014078661 A     5/2014

OTHER PUBLICATIONS

International Search Report and Written Opinion—PCT/US2015/040894—ISA/EPO—Oct. 27, 2015.

*Primary Examiner* — Dzung Tran
(74) *Attorney, Agent, or Firm* — Seyfarth Shaw LLP

(57) ABSTRACT

A device capacitor structure within middle of line (MOL) layers includes a first MOL interconnect layer. The first MOL interconnect layer may include active contacts between a set of dummy gate contacts on an active surface of a semiconductor substrate. The device capacitor structure also includes a second MOL interconnect layer. The second MOL interconnect layer may include a set of stacked contacts directly on exposed ones of the active contacts. The second MOL interconnect layer may also include a set of fly-over contacts on portions of an etch-stop layer on some of the active contacts. The fly-over contacts and the stacked contacts may provide terminals of a set of device capacitors.

8 Claims, 7 Drawing Sheets

(51) Int. Cl.
  *H01L 49/02*   (2006.01)
  *H01L 21/768*  (2006.01)
  *H01L 21/3213* (2006.01)
  *H01L 21/311*  (2006.01)
  *H01L 21/8234* (2006.01)
  *H01L 29/66*   (2006.01)
  *H01L 27/08*   (2006.01)

(56) References Cited

U.S. PATENT DOCUMENTS

| | | |
|---|---|---|
| 7,485,508 B2 | 2/2009 | Dyer et al. |
| 7,682,896 B2 | 3/2010 | Ho et al. |
| 8,319,257 B2 | 11/2012 | Hayashi et al. |
| 8,436,408 B2 | 5/2013 | Tu et al. |
| 2001/0046737 A1* | 11/2001 | Ahn ............... H01L 21/76897 438/253 |
| 2002/0119623 A1* | 8/2002 | Park ............... H01L 21/76801 438/253 |
| 2005/0205918 A1 | 9/2005 | Abiko |
| 2006/0211192 A1* | 9/2006 | Cho ............... H01L 27/10855 438/238 |
| 2007/0278620 A1 | 12/2007 | Hong |
| 2008/0122032 A1* | 5/2008 | Tu ............... H01L 28/91 257/532 |
| 2008/0179638 A1 | 7/2008 | Dyer et al. |
| 2010/0065944 A1* | 3/2010 | Tu ............... H01L 23/5223 257/532 |
| 2011/0210384 A1 | 9/2011 | Xia et al. |
| 2012/0104552 A1* | 5/2012 | Kim ............... H01G 4/002 257/535 |
| 2013/0029470 A1 | 1/2013 | Hataya et al. |
| 2013/0175589 A1 | 7/2013 | Chen |
| 2014/0239363 A1 | 8/2014 | Pan et al. |

* cited by examiner

CAPACITOR FROM SECOND LEVEL MIDDLE-OF-LINE LAYER IN COMBINATION WITH DECOUPLING CAPACITORS

TECHNICAL FIELD

The present disclosure generally relates to integrated circuits (ICs). More specifically, the present disclosure relates to a capacitor from a second level middle-of-line layer in combination with decoupling capacitors.

BACKGROUND

The process flow for semiconductor fabrication of integrated circuits (ICs) may include front-end-of-line (FEOL), middle-of-line (MOL), and back-end-of-line (BEOL) processes. The FEOL process may include wafer preparation, isolation, well formation, gate patterning, spacer, extension and source/drain implantation, silicide formation, and dual stress liner formation. The MOL process may include gate and terminal contact formation. The BEOL processes may include a series of wafer processing steps for interconnecting the semiconductor devices created during the FEOL and MOL processes. Successful fabrication and qualification of modern semiconductor chip products involves an interplay between the materials and the processes employed. In particular, the formation of conductive material plating for passive on glass (POG) devices in BEOL processes is an increasingly challenging part of the process flow.

When fabricating high density capacitors such as metal-oxide-metal (MOM) capacitors or decoupling capacitors, a challenge that remains is saving chip area and boosting chip performance while limiting the number of capacitors. The number of capacitors for high performance devices continually increases due to the scaling of integrated circuits. Therefore, being able to efficiently achieve high capacitance levels with a limited number of high density capacitors is a concern.

SUMMARY

A device capacitor structure within middle of line (MOL) layers includes a first MOL interconnect layer. The first MOL interconnect layer may include active contacts between a set of dummy gate contacts on an active surface of a semiconductor substrate. The device capacitor structure also includes a second MOL interconnect layer. The second MOL interconnect layer may include a set of stacked contacts directly on exposed ones of the active contacts. The second MOL interconnect layer may also include a set of fly-over contacts on portions of an etch-stop layer on some of the active contacts. The fly-over contacts and the stacked contacts may provide terminals of a set of device capacitors.

A method of fabricating a device capacitor structure within middle of line (MOL) layers includes fabricating a first MOL interconnect layer. The first MOL interconnect layer may include active contacts between dummy gate contacts on an active surface of a semiconductor substrate. The method also includes depositing an etch-stop layer on the first MOL interconnect layer. The method further includes fabricating a second MOL interconnect layer. The second MOL interconnect layer may include stacked contacts directly on exposed ones of the active contacts, and fly-over contacts on portions of the etch-stop layer on some of the active contacts. The fly-over contacts and the stacked contacts may providing terminals of a set of device capacitors.

A device capacitor structure within middle of line (MOL) layers includes a first MOL interconnect layer. The first MOL interconnect layer may include active contacts between a set of dummy gate contacts on an active surface of a semiconductor substrate. The device capacitor structure also includes a second MOL interconnect layer. The second MOL interconnect layer may include a set of stacked contacts directly on exposed ones of the active contacts. The second MOL interconnect layer may also include a set of fly-over contacts on portions of a means for etch-stopping on some of the active contacts. The fly-over contacts and the stacked contacts may provide terminals of a set of device capacitors.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
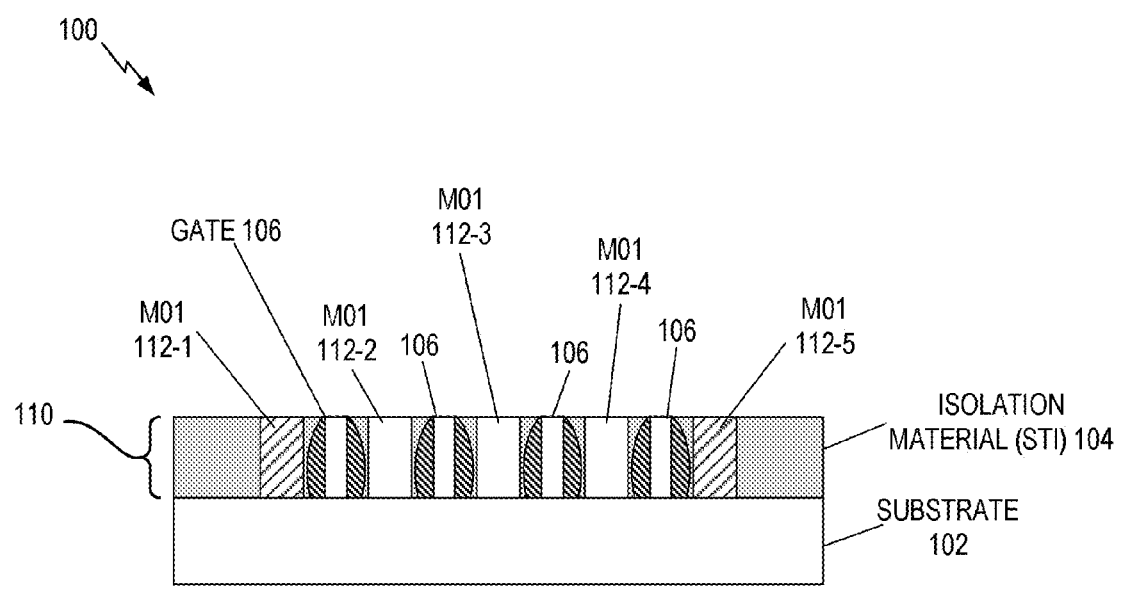
FIG. 1 illustrates a side view of a semiconductor circuit.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Semiconductor fabrication processes are often divided into three parts: a front end of line (FEOL), a middle of line (MOL) and a back end of line (BEOL). Front end of line processes include wafer preparation, isolation, well formation, gate patterning, spacers, and dopant implantation. A middle of line process includes gate and terminal contact formation. The gate and terminal contact formation of the middle of line process, however, is an increasingly challenging part of the fabrication flow, particularly for lithography patterning. Back end of line processes include forming interconnects and dielectric layers for coupling to the FEOL devices. These interconnects may be fabricated with a dual damascene process using plasma-enhanced chemical vapor deposition (PECVD) deposited interlayer dielectric (ILD) materials.

More recently, the number of interconnect levels for circuitry has substantially increased due to the large number of transistors that are now interconnected in a modern microprocessor. The increased number of interconnect levels for supporting the increased number of transistors involves more intricate middle of line processes to perform the gate and terminal contact formation.

As described herein, the middle of line interconnect layers may refer to the conductive interconnects for connecting a first conductive layer (e.g., metal 1 (M1)) to the oxide diffusion (OD) layer of an integrated circuit as well for connecting M1 to the active devices of the integrated circuit. The middle of line interconnect layers for connecting M1 to the OD layer of an integrated circuit may be referred to as "MD1" and "MD2." The middle of line interconnect layer for connecting M1 to the conductive gates of an integrated circuit may be referred to as "MP."

Routing middle of line interconnect layers around undesired contacts may involve additional vias between the middle of line interconnect layers. The additional vias between the middle of line interconnect layers may increase the complexity and cost of fabrication. Moreover, additional vias between the middle of line interconnect layers may increase the failure modes of the circuit. In one aspect of the present disclosure, a second MOL conductive layer provides an additional set of local interconnects using existing process technology.

FIG. 1 shows a cross-sectional view illustrating an integrated circuit (IC) device 100 in which routing of conductive layers is performed within a first middle of line (MOL) interconnect layer 110 according to one aspect of the disclosure. The IC device 100 includes a semiconductor substrate (e.g., a silicon wafer) 102 having shallow trench isolation (STI) regions (e.g., isolation material 104). Within the isolation material 104 and the substrate 102 is an active region in which active devices having a source region, a drain region, and a gate region (e.g., gate 106) are formed.

Also in FIG. 1, the first MOL interconnect layer 110 includes a set of active (oxide diffusion (OD)) contacts (M01) 112 (M01 112-1, M01 112-2, M01 112-3, M01 112-4, and M01 112-5) that are fabricated on the substrate 102 using existing process technology. The active contacts 112 may be coupled to the active devices (e.g., the source and drain regions) within the first MOL interconnect layer 110. In one configuration, a routing of the conductive layers may be performed within a second MOL interconnect layer using an additional set of local interconnects. The conductive layers may be composed of tungsten or other like conductive materials.

Capacitance density is beneficial to device performance. For example, high density capacitors, such as metal-oxide-metal (MOM) capacitors or decoupling capacitors, help save chip area and boost chip performance. The number of high density capacitors for high performance devices may continually increase with the exponential scaling of integrated circuits. Therefore, being able to efficiently achieve high capacitance levels with a limited number of high density capacitors is a concern.

According to an aspect of the present disclosure, a new, additional middle of line (MOL) capacitance is provided that can be used in combination with other capacitors. This additional capacitance from one of the MOL layers is an efficient and effective way to obtain capacitance without increasing the number of high density capacitors. The layers of the MOL used to generate this additional capacitance may be the second MOL interconnect layer between the front-end-of-line (FEOL) active devices and the back-end-of-line (BEOL) conductive layers (e.g., M1, M2, and other conductive material layers).

Figure 2A:
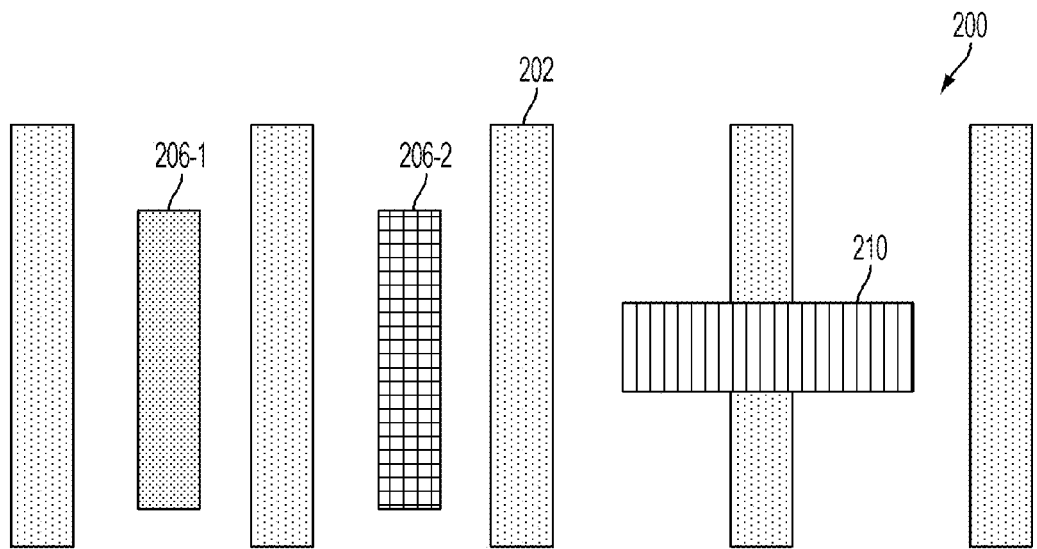
FIGS. 2A and 2B show cross-sectional views of a device fabricated from a middle of the line fabrication process.
Figure 2B:
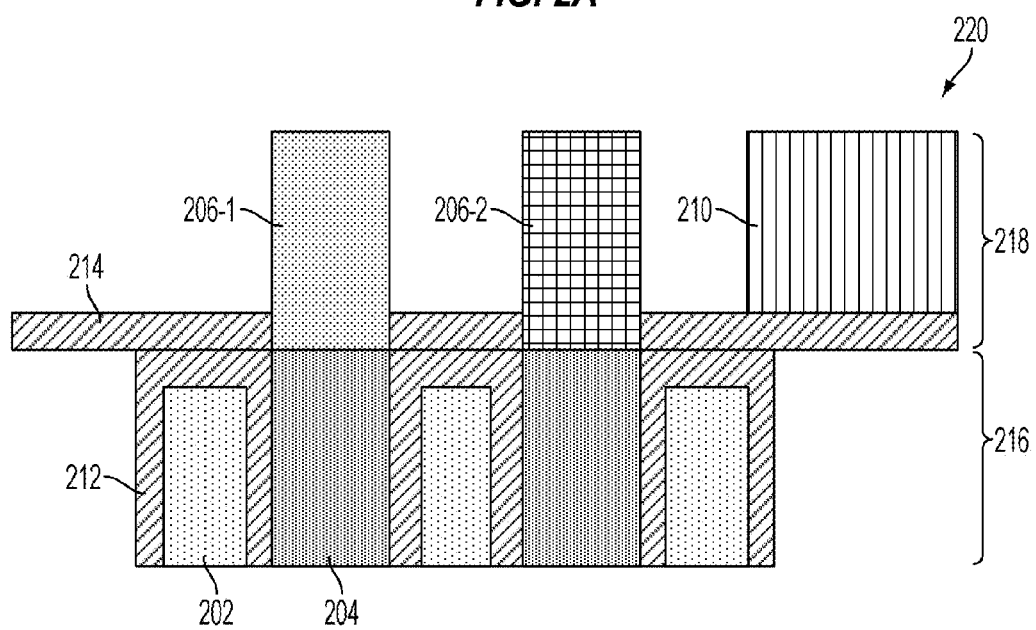

FIGS. 2A and 2B show cross-sectional views of a device fabricated from a middle of the line fabrication process.

FIG. 2A shows a top view 200 of a layout of middle-of-line (MOL) layers of a device. The elements that can be seen from the top view 200 include gate contacts 202 (or dummy gate contacts (M03)), stacked contacts 206 (206-1 and 206-2 (M02)), and a fly-over contacts 210 (M02). The stacked contacts 206 cover and extend in the same direction as an active contacts 204, which can be seen in FIG. 2B. The gate contacts 202 and the stacked contacts 206 also extend in the same direction. The fly-over contacts 210, however, extends in a different direction (e.g., an orthogonal direction) from the direction in which the gate contacts 202 and the stacked contacts 206 extend. The fly-over contacts 210 can remain isolated from the gate contacts 202 and allow coupling to other additional conductive material layers that are not shown. There may be isolation between the fly-over contacts 210 and the gate contacts 202, due to the nature of the MOL fabrication process.

FIG. 2B shows a cross-sectional view 220 of various MOL layers of a device. The elements that can be seen from the cross-sectional view 220 are divided into a first MOL interconnect layer 216 (M01) and a second MOL interconnect layer 218 (M02). The first MOL interconnect layer 216 includes active contacts 204, the gate contacts 202, and dielectric material 212. The second MOL interconnect layer 218 includes an etch-stop layer 214, the stacked contacts 206-1, the stacked contacts 206-2, and the fly-over contacts 210. Isolation can also be seen between the fly-over contacts 210 and the gate contacts 202.

At least two different masks may fabricate the stacked contacts 206-1 and the stacked contacts 206-2. An additional mask may also fabricate the fly-over contacts 210. Each of the different mask patterns may also result in different etch depths. Fabrication of the stacked contacts 206-1, the stacked contacts 206-2 and the fly-over contacts 210 may include deposition, patterning, exposure, and etching.

Because of the arrangement of the various components in the device shown in FIGS. 2A-2B, no additional or extra capacitance is generated. No additional capacitance is generated because the fly-over contacts 210 is oriented in a direction perpendicular to the direction of the stacked contacts 206-1 and 206-2. Therefore, there is no way for the conductive material of the fly-over contacts 210 and either of the stacked contacts 206-1, 206-2 to form plates of a capacitor to generate additional capacitance. As a result, the device design shown in FIGS. 2A-2B may be inefficient in terms of high density capacitance in that the design generates no additional capacitance, and would involve the fabrication of actual capacitor components on already-fabricated components.

Figure 3A:
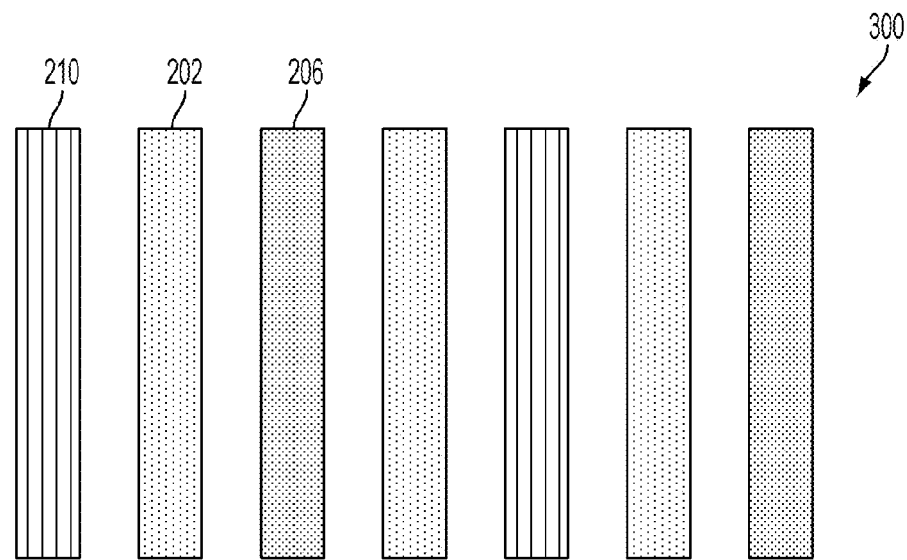
FIGS. 3A and 3B show cross-sectional views of a device capacitor structure fabricated from a middle of the line fabrication process according to one aspect of the disclosure.
Figure 3B:
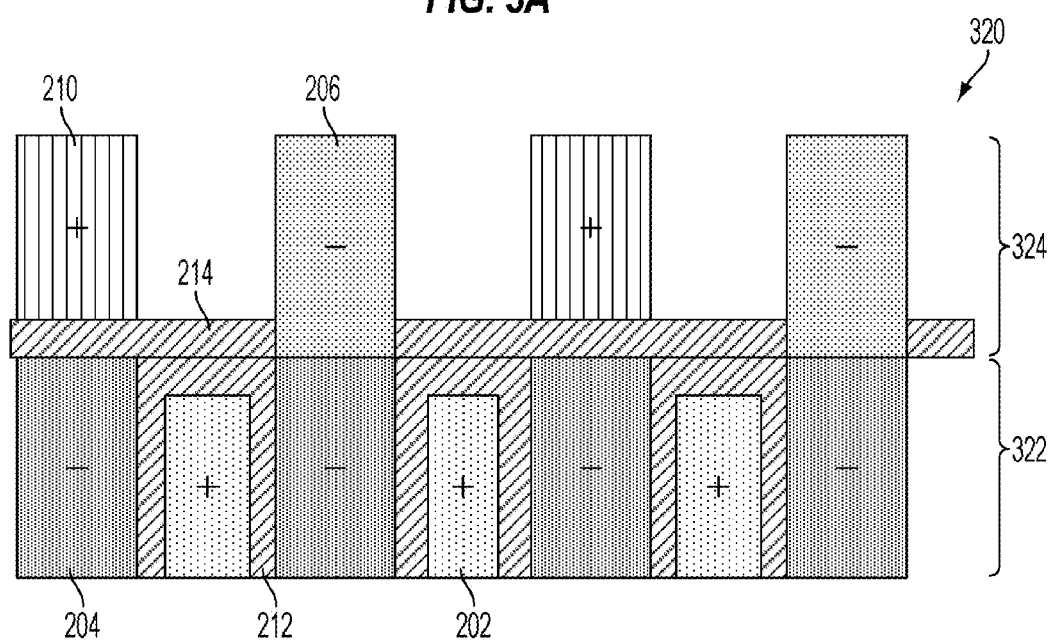

FIGS. 3A and 3B show cross-sectional views of a device capacitor structure fabricated from a middle of the line fabrication process according to one aspect of the disclosure.

FIG. 3A is a top view 300 of a layout of middle-of-line (MOL) layers of a device capacitor structure according to an aspect of the disclosure. FIG. 3A shows similar elements as FIG. 2A. The fly-over contacts 210 in FIG. 3A can be seen as extending in the same direction (e.g., parallel) to the direction in which the gate contacts 202 and the stacked contacts 206 extend. In this configuration, the fly-over contacts 210 may be patterned using a fly-over process and printed to fabricate the fly-over contacts 210. The direction shown in FIG. 3A in which the fly-over contacts 210 and the gate contacts 202 extend is shown as being vertical, but it can also be horizontal. Having the fly-over contacts 210 extend in the same direction as the stacked contacts 206 brings about a number of advantages, as further explained with respect to FIG. 3B.

FIG. 3B is a cross-sectional view 320 of various MOL layers of a device capacitor structure according to an aspect of the disclosure. The cross-sectional view 320 of FIG. 3B shows a first MOL interconnect layer 322 and a second MOL interconnect layer 324. Also, various "+" or "−" signs appear on the components to indicate whether a component has a positive or negative electric charge. Consequently, capacitance occurs or capacitors may be created between components that have a + sign and components that have a − sign.

In this configuration, a dielectric material 212 surrounds the gate contacts 202 between the active contacts 204 within the first MOL interconnect layer 322. The etch-stop layer 214, which may also be a dielectric material, can be seen positioned between the fly-over contacts 210 and the stacked contacts 206 within the second MOL interconnect layer 324. The dielectric material 212 may include silicon nitride (SiN), silicon carbide (SiC) and/or silicon carbon nitride (SiCN). The etch-stop layer 214 may be the same material as the dielectric material 212, and also include silicon nitride and/or silicon carbon nitride. Although not shown in FIG. 3B, an oxide material may be deposited on the etch-stop layer 214 between the fly-over contacts 210 and the stacked contacts 206 of the second MOL interconnect layer 324. The oxide material can include silicon oxide. The gate contacts 202 may be a contact to a dummy gate in which no signals are fed into the gate, and such "dummy" components are not used as active or functioning components of a transistor. The components shown in FIG. 3B may also be disposed on an active surface of a semiconductor substrate.

Various components such as the gate contacts 202, the active contacts 204, the stacked contacts 206, and the fly-over contacts 210 may also be printed on a layer of dielectric material, for example, to be formed within the device capacitor structure. For example, following formation of the gate contacts 202 (M03), the active contacts 204 (M01) are patterned and etched. After patterning and etching of the active contacts 204, a conductive material (e.g., tungsten (W)) is used to fill the defined region followed by a chemical mechanical polish (CMP) to complete formation of the active contacts 204. This conductive material fill process may be performed by printing the conductive material within the defined regions to complete the first MOL interconnect layer.

Following formation of the first MOL interconnect layer 322 (M01), the second MOL interconnect layer 324 (M02), including the etch-stop layer 214, is then deposited. A patterning and etching process is then performed to define a first one of the stacked contacts 206-1, a second one of the stacked contacts 206-2, followed by one of the fly-over contacts 210. Patterning and etching to define the one of fly-over contacts 210, however, is performed at a different elevation than the first of the stacked contacts 206-1 and the second of the stacked contacts 206-2. Once defined, a conductive material (e.g., tungsten (W)) is used to fill the defined regions followed by a chemical mechanical polish (CMP) to complete formation of first one of the stacked contacts 206-1, the second one of the stacked contacts 206-2 and the one of the fly-over contacts 210.

Figure 3C:
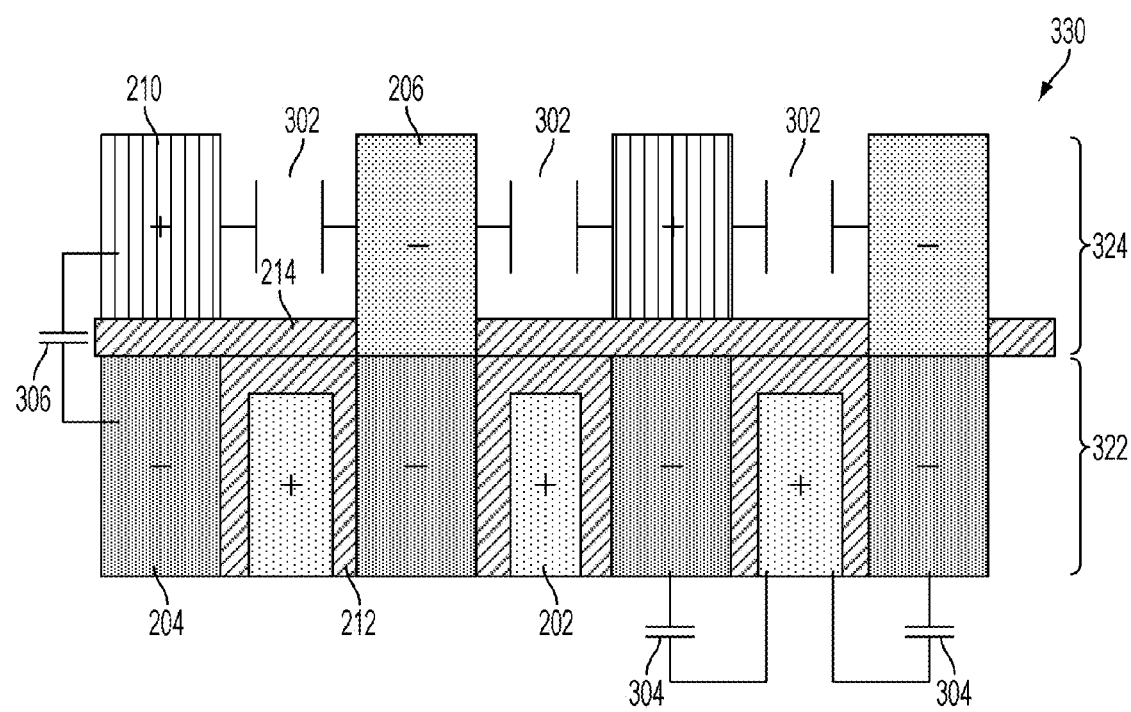
FIG. 3C shows a cross-sectional view of a device capacitor structure fabricated from a middle of the line fabrication process according to one aspect of the disclosure.

According to an aspect of the present disclosure, various capacitance values may be formed in the device capacitor structure, as further described in FIG. 3C. These capacitance values include additional capacitance formed between the fly-over contacts 210 and the stacked contacts 206, such as the device capacitors 302.

FIG. 3C shows a cross-sectional view 330 of a device capacitor structure fabricated from a middle of the line fabrication process according to one aspect of the disclosure.

Cross-sectional view 330 has similar elements to cross-sectional view 320 of FIG. 3B, with the exception of various capacitors or capacitance values being shown, such as one of the device capacitors 302, one of the decoupling capacitors 304, and one of the MOM capacitors 306.

The device capacitors 302 are formed between the fly-over contacts 210 and the stacked contacts 206 of the second MOL interconnect layer 324. Because the fly-over contacts 210 and the stacked contacts 206 are formed in the same direction, i.e., are parallel (as shown in FIG. 3A), capacitance can be more readily created between those two components. During the fabrication process, the fly-over contacts 210 is patterned to extend in the same direction as the stacked contacts 206. The direction is shown as vertical in FIG. 3A, but can also be horizontal.

Decoupling capacitors 304 (also known as "decaps") may be traditional metal-oxide-semiconductor (MOS) decoupling capacitors, and are formed between the gate contacts 202 and the active contacts 204 of the first MOL interconnect layer 322.

MOM capacitors 306 are formed between the fly-over contacts 210 in the second MOL interconnect layer 324 and the active contacts 204 in the first MOL interconnect layer 322, with the etch-stop layer 214 in between the fly-over contacts 210 and the active contacts 204. The etch-stop layer 214 may also be an oxide or a nitride such as SiN and may also have a high k value.

There may also be some capacitance (not shown) formed between the gate contacts 202 and the channel region of a transistor, if the two surrounding ones of the active contacts 204 of the gate (e.g., the gate contacts 202) form the source and drain of that transistor.

The collective capacitance formed between the fly-over contacts 210 and the stacked contacts 206 and also including the etch-stop layer 214 (which might be a high k material) may also be greater than or equal to the amount of capacitance formed from a dense conductive material layer (or possibly a lower layer) of a MOM capacitor. A difference is that in the case of the MOL device of FIG. 3C, high-k material is being used (in the etch-stop layer 214, for example) whereas the MOM capacitor may use low-k material between its conductive layers.

The additional capacitance formed between the parallel components of the fly-over contacts 210 and the stacked contacts 206 may also be combined with capacitance from the decoupling capacitors 304, the MOM capacitors 306, and other capacitance values that exist in FIG. 3C, as described above.

The process to form the device in FIG. 3C is efficient in terms of mask usage. For example, mask used to fabricate the fly-over contacts 210 in the process described for FIGS. 2A-2B is reused to provide additional capacitance to provide improved design density. Therefore, the above-described middle-of-line (MOL) fabrication process of the present disclosure not only generates additional capacitance but is also efficient in terms of mask usage.

Figure 4:
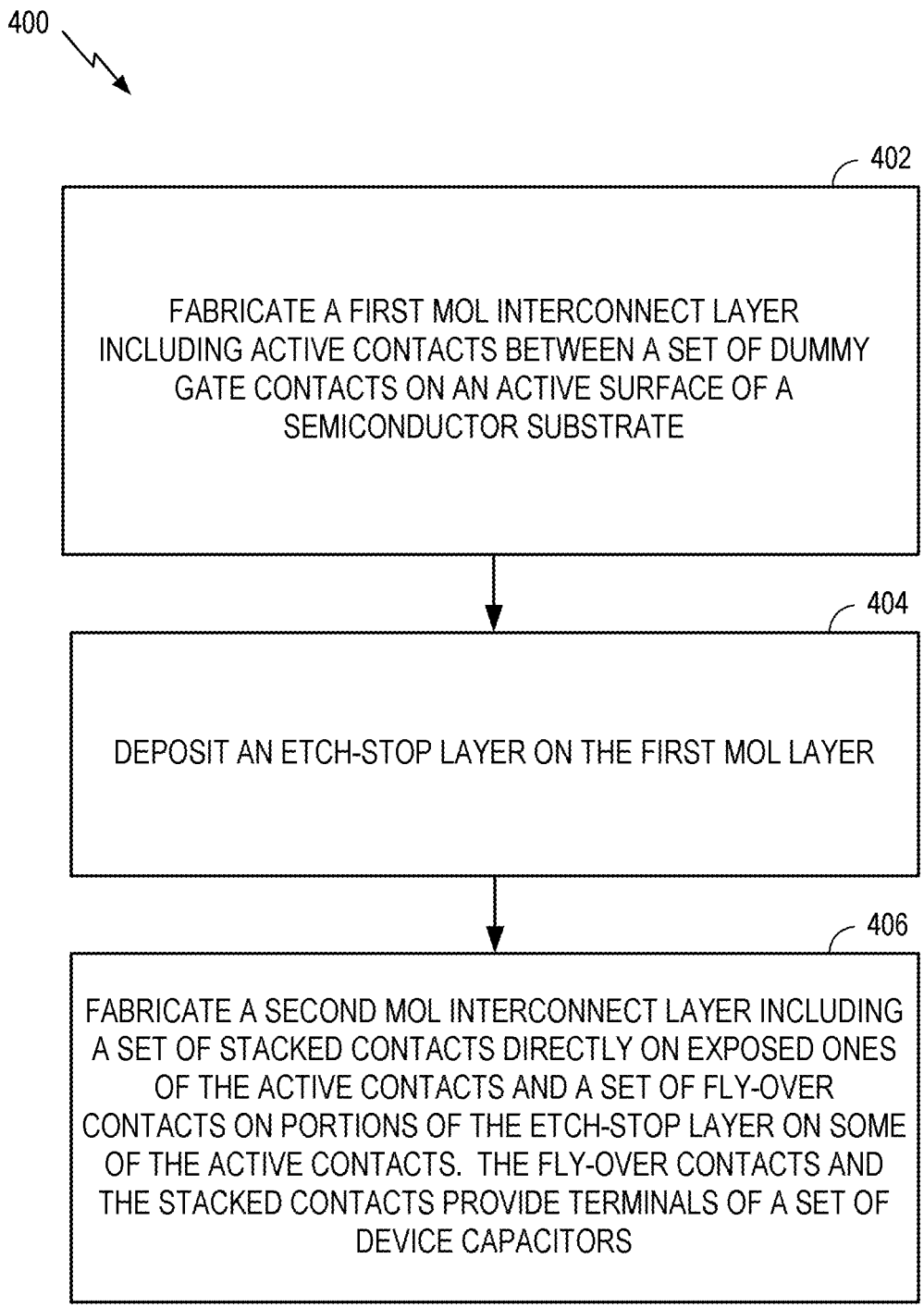
FIG. 4 is a process flow diagram illustrating a middle of the line fabrication process according to aspects of the disclosure.

FIG. 4 is a process flow diagram illustrating a middle of line fabrication process 400 according to an aspect of the disclosure. In block 402, a first middle of line (MOL) interconnect layer (e.g., first MOL interconnect layer 322) is fabricated. The first MOL interconnect layer may include active contacts (e.g., active contacts 204) between a set of dummy gate contacts (e.g., gate contacts 202) on an active surface of a semiconductor substrate. In block 404, an etch-stop layer (e.g., the etch-stop layer 214) is deposited on the first MOL interconnect layer. In block 406, a second MOL interconnect layer (e.g., the second MOL interconnect layer 324) is fabricated. The second MOL interconnect layer may include a set of stacked contacts (e.g., stacked contacts 206) directly on exposed ones of the active contacts. The second MOL interconnect layer may also include a set of fly-over contacts (e.g., fly-over contacts 210) on portions of the etch-stop layer on some of the active contacts. The fly-over contacts and the stacked contacts provide terminals of a set of device capacitors (e.g., device capacitors 302).

In one configuration, fabricating the second MOL layer includes fabricating the set of stacked contacts directly on exposed ones of the active contacts and fabricating the set of fly-over contacts on portions of the etch stop layer on some of the active contacts. For example, as shown in FIG. 3B, fabricating the second MOL interconnect layer may include etching predetermined portions of the etch-stop layer 214 on the first MOL interconnect layer 322 to expose predetermined ones of the active contacts 204. Fabrication of the second MOL interconnect layer 324 may also include patterning the etch-stop layer 214 proximate to the exposed, predetermined ones of the active contacts 204 using, for example, a stacked contact mask. In this example, fabrication of the second MOL interconnect layer 324 includes depositing a conductive matter on the patterned portions of the etch-stop layer 214 to fabricate the stacked contacts 206 directly on the exposed, predetermined ones of the active contacts 204.

Fabrication of the second MOL interconnect layer 324 may also include fly-over contacts formation. For example, as shown in FIG. 3B, an insulation material (e.g., an oxide) may be deposited on the stacked contacts 206 and the etch-stop layer 214. In this example, the insulation material is patterned using a fly-over mask to expose the portions of the etch-stop layer 214 on some of the active contacts 204. Alternatively, a photoresist may define the fly-over contacts. A conductive material may be printed (or deposited) on the exposed portions of the etch-stop layer 214 and within the insulation material. Depositing or printing of the conductive material forms the fly-over contacts 210 on the portions of the etch-stop layer 214 on some of the active contacts 204. The set of stacked contacts, the set of fly-over contacts and the insulation material may be polished.

In one configuration, a device capacitor structure within middle of line (MOL) layers includes a first MOL layer including active contacts between a set of dummy gate contacts on an active surface of a semiconductor substrate. The device capacitor structure also includes a second MOL layer including a set of stacked contacts directly on exposed ones of the active contacts and a set of fly-over contacts on portions of a means for etch-stopping on some of the active contacts. In one aspect of the disclosure, the etch-stopping means may be the etch-stop layer 214. In another aspect, the aforementioned means may be any material or structure configured to perform the functions recited by the aforementioned means.

In one configuration, the set of device capacitors may also provide an additional capacitance in combination with a set of decoupling capacitors and a set of MOM capacitors. In one configuration, the fly-over contacts and some of the active contacts provide terminals of a set of MOM capacitors. The first MOL layer may also include dielectric material between the set of dummy gate contacts and the set of active contacts, the dielectric material can be silicon nitride and/or silicon carbon nitride.

The conductive material used for the various conductive material layers such as the gate contacts 202, the active contacts 204, the stacked contacts 206-1, 206-2 and 206, and the fly-over contacts 210 may be copper (Cu), silver (Ag), annealed copper (Cu), gold (Au), aluminum (Al), calcium (Ca), tungsten (W), zinc (Zn), nickel (Ni), lithium (Li), iron (Fe), or other conductive materials with high conductivity. The aforementioned conductive material layers may also be deposited by electroplating, chemical vapor deposition (CVD), physical vapor deposition (PVD), sputtering, or evaporation.

The dielectric material 212 and the etch-stop layer 214 may be materials having a high k, or a high dielectric constant value, including silicon nitride (SiN), silicon carbide (SiC), silicon carbon nitride (SiCN) and other materials. If the material has a low k, example materials that can be used include silicon dioxide ($SiO_2$) and its fluorine-doped, carbon-doped, and porous carbon-doped forms, as well as spin-on organic polymeric dielectrics such as polyimide, polynorbornenes, benzocyclobutene (BCB) and polytetrafluoroethylene (PTFE), spin-on silicone based polymeric dielectrics, silicon nitrogen-containing oxycarbides (SiCON), carbon or hydrogen doped silicon dioxide ($SiO_2$). The insulation material within the second MOL interconnect layer 324 disposed between the fly-over contacts 210 and the stacked contacts 206 may also include silicon oxide or doped silicon dioxide. These aforementioned layers may also be deposited by a spin-coating process, chemical vapor deposition (CVD), physical vapor deposition (PVD), sputtering, or evaporation.

Although not mentioned in the above process steps, photoresist, ultraviolet exposure through masks, photoresist development and lithography may be used. Photoresist layers may be deposited by spin-coating, droplet-based photoresist deposition, spraying, chemical vapor deposition (CVD), physical vapor deposition (PVD), sputtering, or evaporation. Photoresist layers may then be exposed and then etched by chemical etching processes using solutions such as Iron Chloride ($FeCl_3$), Cupric Chloride ($CuCl_2$) or Alkaline Ammonia ($NH_3$) to wash away the exposed photoresist portions, or dry etching processes using plasmas.

Photoresist layers may also be stripped by a chemical photoresist stripping process or a dry photoresist stripping process using plasmas such as oxygen, which is known as ashing.

Figure 5:
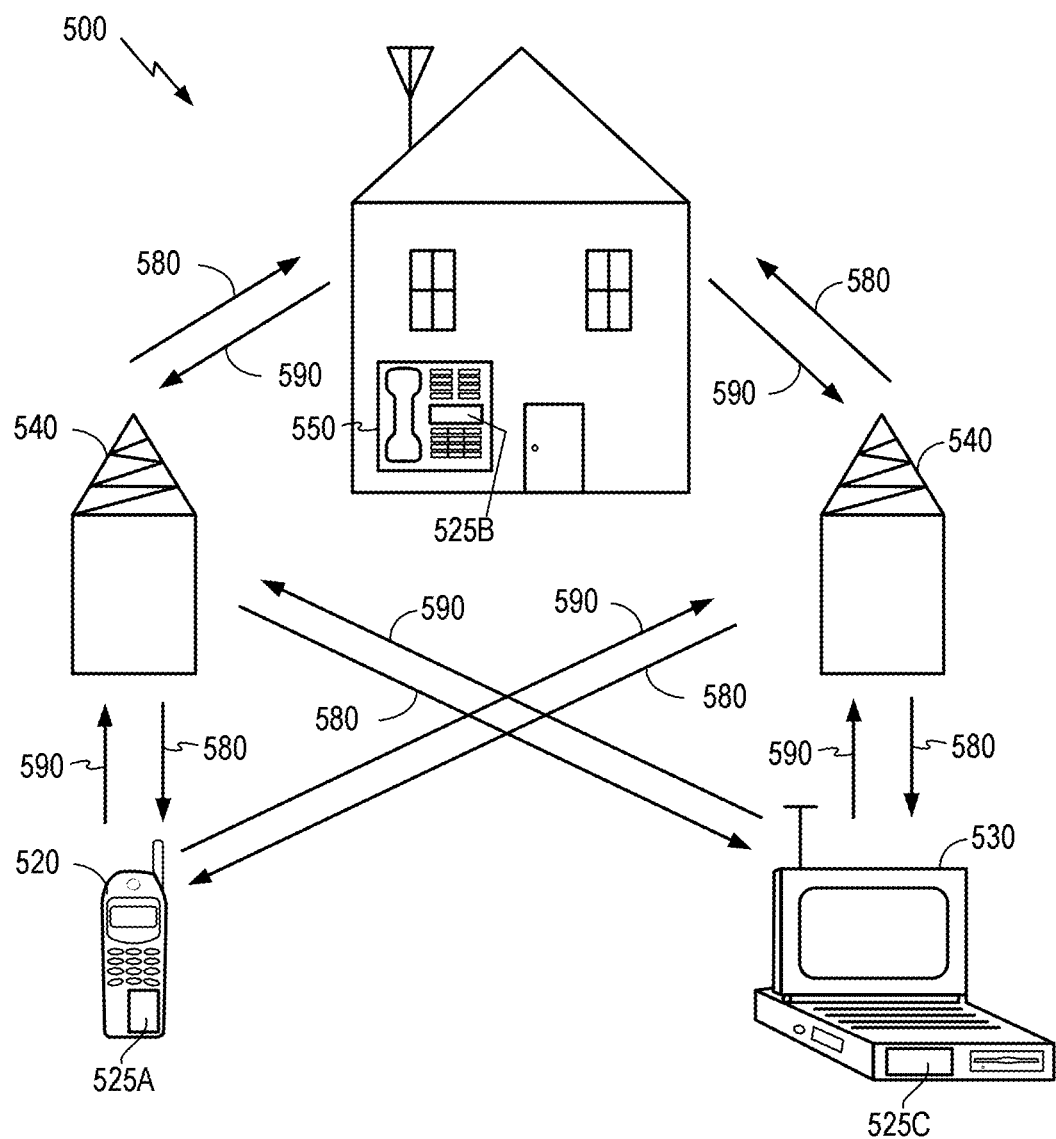
FIG. 5 is a block diagram showing an exemplary wireless communication system in which a configuration of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C, and 525B that include the disclosed devices (e.g., device capacitor MOL structures). It will be recognized that other devices may also include the disclosed devices (e.g., device capacitor MOL structures), such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as a meter reading equipment, or other devices that store or retrieve data or computer instructions, or combinations thereof. Although FIG. 5 illustrates remote units according to the aspects of the disclosure, the disclosure is not limited to these exemplary illustrated units. Aspects of the disclosure may be suitably employed in many devices, which include the disclosed devices.

Figure 6:
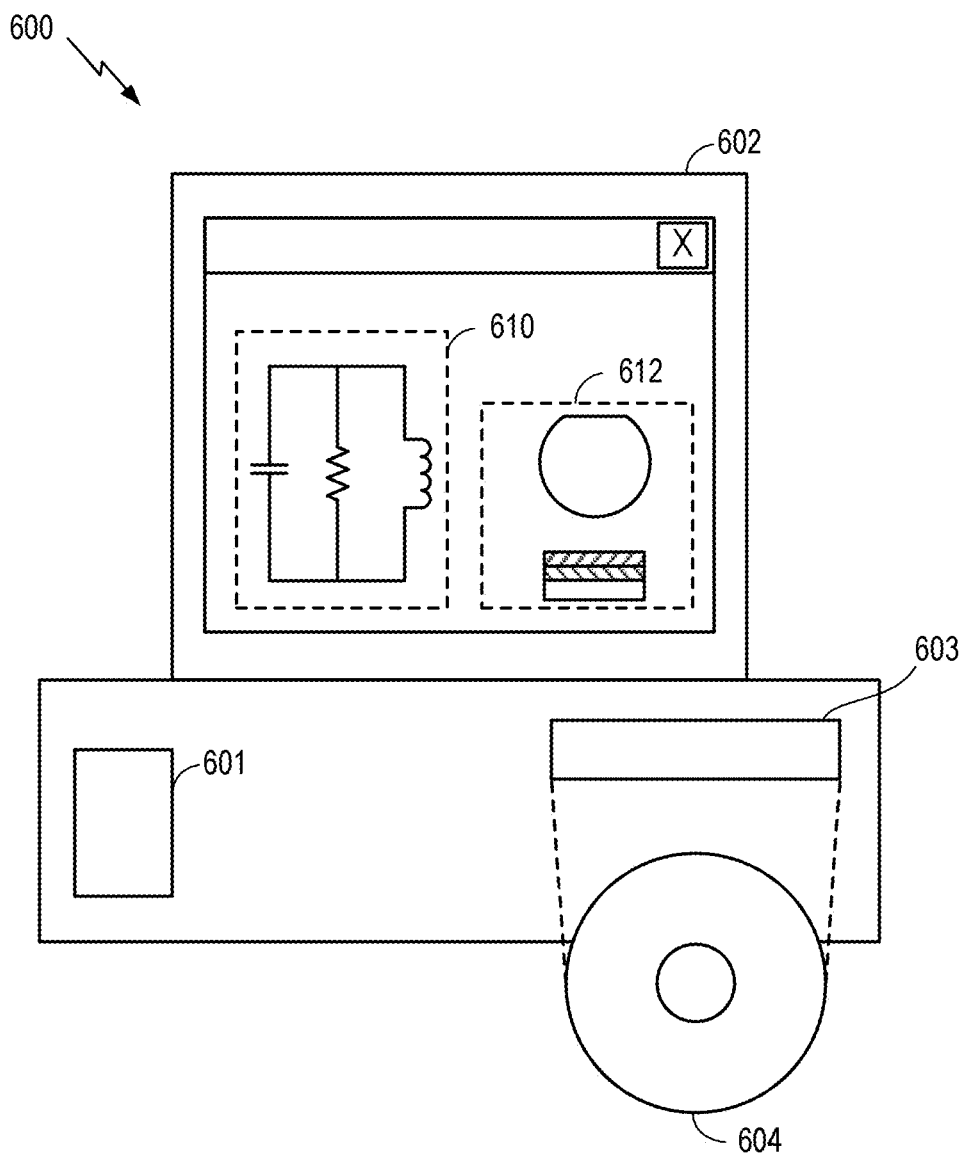
FIG. 6 is a block diagram illustrating a design workstation used for circuit, layout, and logic design of a semiconductor component according to one configuration.

FIG. 6 is a block diagram illustrating a design workstation 600 used for circuit, layout, and logic design of a semiconductor component, such as the devices disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as the disclosed device (e.g., device capacitor MOL structures). A storage medium 604 is provided for tangibly storing the circuit design 610 or the semiconductor component 612. The circuit design 610 or the semiconductor component 612 may be stored on the storage medium 604 in a file format such as GDSII or GERBER. The storage medium 604 may be a CD-ROM, a DVD, a hard disk, a flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit design 610 or the semiconductor component 612 by decreasing the number of processes for designing semiconductor wafers or dies.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A capacitor structure within middle of line (MOL) layers, comprising:
    a first MOL layer comprising:
        active contacts within the first MOL layer, the active contacts arranged between a plurality of dummy gate contacts on an active surface of a semiconductor substrate, and
        a dielectric material between the plurality of dummy gate contacts and the active contacts, and
        at least one decoupling capacitor comprised of one of the plurality of dummy gate contacts, the dielectric material, and one of the plurality of active contacts;
    a second MOL layer comprising:
        a plurality of stacked contacts, directly on exposed ones of the active contacts, and
        a plurality of fly-over contacts, on portions of an etch-stop layer on some of the active contacts, the fly-over contacts and the stacked contacts comprising a plurality of device capacitors; and
    at least one metal-oxide-metal capacitor comprising one of the plurality of active contacts of the first MOL layer, one of the portions of the etch-stop layer, and one of the plurality of fly-over contacts of the second MOL layer.

2. The capacitor structure of claim 1, in which the stacked contacts comprise terminals of the at least one decoupling capacitor.

3. The capacitor structure of claim 1, in which the dielectric material comprises silicon nitride and/or silicon carbon nitride.

4. The capacitor structure of claim 1 incorporated into an integrated circuit which is part of at least one of a music player, a video player, an entertainment unit, a navigation device, a communications device, a personal digital assistant (PDA), a fixed location data unit, and a computer.

5. A capacitor structure within middle of line (MOL) layers, comprising:
    a first MOL layer comprising:
        active contacts within the first MOL layer, the active contacts arranged between a plurality of dummy gate contacts and on an active surface of a semiconductor substrate,
        a dielectric material between the plurality of dummy gate contacts and the active contacts, and
        at least one decoupling capacitor comprised of one of the plurality of dummy gate contacts, the dielectric material, and one of the plurality of active contacts;
    a second MOL layer comprising:
        a plurality of stacked contacts, directly on exposed ones of the active contacts, and
        a plurality of fly-over contacts, on portions of a means for etch-stopping on some of the active contacts, the fly-over contacts and the stacked contacts comprising a plurality of device capacitors; and
    at least one metal-oxide-metal capacitor comprising one of the plurality of active contacts of the first MOL layer, one of the portions of the etch-stopping means, and one of the plurality of fly-over contacts of the second MOL layer.

6. The capacitor structure of claim 5, in which the stacked contacts comprise terminals of the at least one decoupling capacitor.

7. The capacitor structure of claim 5, in which the dielectric material between the plurality of dummy gate contacts and the active contacts comprises silicon nitride and/or silicon carbon nitride.

8. The capacitor structure of claim 5 incorporated into an integrated circuit which is part of at least one of a music player, a video player, an entertainment unit, a navigation device, a communications device, a personal digital assistant (PDA), a fixed location data unit, and a computer.

* * * * *